(12) United States Patent  (10) Patent No.: US 9,036,434 B1
Wu  (45) Date of Patent: May 19, 2015

(54) RANDOM ACCESS MEMORY AND METHOD OF ADJUSTING READ TIMING THEREOF

(71) Applicant: Nanya Technology Corp., Taoyuan (TW)

(72) Inventor: Shun-Ker Wu, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 14/069,289

(22) Filed: Oct. 31, 2013

(51) Int. Cl.
*G11C 7/22* (2006.01)
*G11C 7/00* (2006.01)
*G11C 11/4076* (2006.01)
*G11C 8/18* (2006.01)
*G11C 7/10* (2006.01)

(52) U.S. Cl.
CPC ............. *G11C 7/222* (2013.01); *G11C 7/1066* (2013.01); *G11C 8/18* (2013.01); *G11C 7/22* (2013.01); *G11C 11/4076* (2013.01); *G11C 2207/2272* (2013.01)

(58) Field of Classification Search
CPC ........ G11C 7/222; G11C 7/1066; G11C 8/18; G11C 7/22; G11C 11/4076; G11C 2207/2272
USPC ............................... 365/191, 193, 194, 233.1
See application file for complete search history.

(56) References Cited

U.S. PATENT DOCUMENTS

| | | | |
|---|---|---|---|
| 5,808,961 A * | 9/1998 | Sawada | 365/233.1 |
| 6,337,832 B1 * | 1/2002 | Ooishi et al. | 365/233.12 |
| 2004/0105292 A1 * | 6/2004 | Matsui | 365/63 |
| 2012/0159229 A1 * | 6/2012 | Janzen | 713/400 |
| 2013/0182516 A1 * | 7/2013 | Kinoshita | 365/194 |
| 2014/0015575 A1 * | 1/2014 | Jung | 327/156 |

* cited by examiner

*Primary Examiner* — Ly D Pham

(57) ABSTRACT

A method of adjusting read timing of a random access memory. The method includes providing a Column Address Strobe (CAS) value for defining an CAS latency (CL) of the random access memory; generating a shift margin according to the CAS latency and a reference latency; generating a read command for accessing the random access memory; dynamically generating a Column Select (CS) signal and adjusting output timing of the CS signal according to the shift margin, after the read command is generated.

6 Claims, 3 Drawing Sheets

RANDOM ACCESS MEMORY AND METHOD OF ADJUSTING READ TIMING THEREOF

BACKGROUND OF THE INVENTION

1. Field of the Invention

The present invention relates to random access memories, and in particular relates to a method of adjusting read timing of random access memories.

2. Description of the Related Art

The access time of a random access memory (RAM) is a crucial factor for improving the performance and speed of an electronic system. The RAS (Row Address Strobe) to CAS (Column Address Strobe) latency is a delay time between an active command and a read command sent from a command decoder in a random access memory, and CAS (Column Address Strobe) latency is a delay time between the time the read command is sent and the time the memory data is ready to be read out at a data bus. After the read command is sent, a column select signal is subsequently (later than the read command being output for a predetermined time) output by a column enable circuit in the random access memory. In conventional art, the output timing of the column select signal is not flexible, thus missing an opportunity for improving operation of Read data-path transmission or operation of bit-line for the random access memory.

BRIEF SUMMARY OF THE INVENTION

One exemplary embodiment of the disclosure is a method of adjusting the read timing of a random access memory. The method comprises: providing a Column Address Strobe (CAS) value for defining an CAS latency (CL) of the random access memory; generating a shift margin according to the CAS latency and a reference latency; generating a read command for accessing the random access memory; generating a Column Select (CS) signal and adjusting output timing of the CS signal according to the shift margin, after the read command is generated.

Another exemplary embodiment of the disclosure is a random access memory, comprises: a command decoder, outputting a read command for accessing the random access memory, wherein the command decoder further outputs a mode register (MRS) command having a Column Address Strobe (CAS) value for defining a CAS latency (CL) of the random access memory; a shift calculating circuit, generating a shift margin according to the CAS latency and a reference latency; and a column enable circuit, generating a Column Select (CS) signal and adjusting output timing of the CS signal according to the shift margin, after the command decoder has output the read command.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
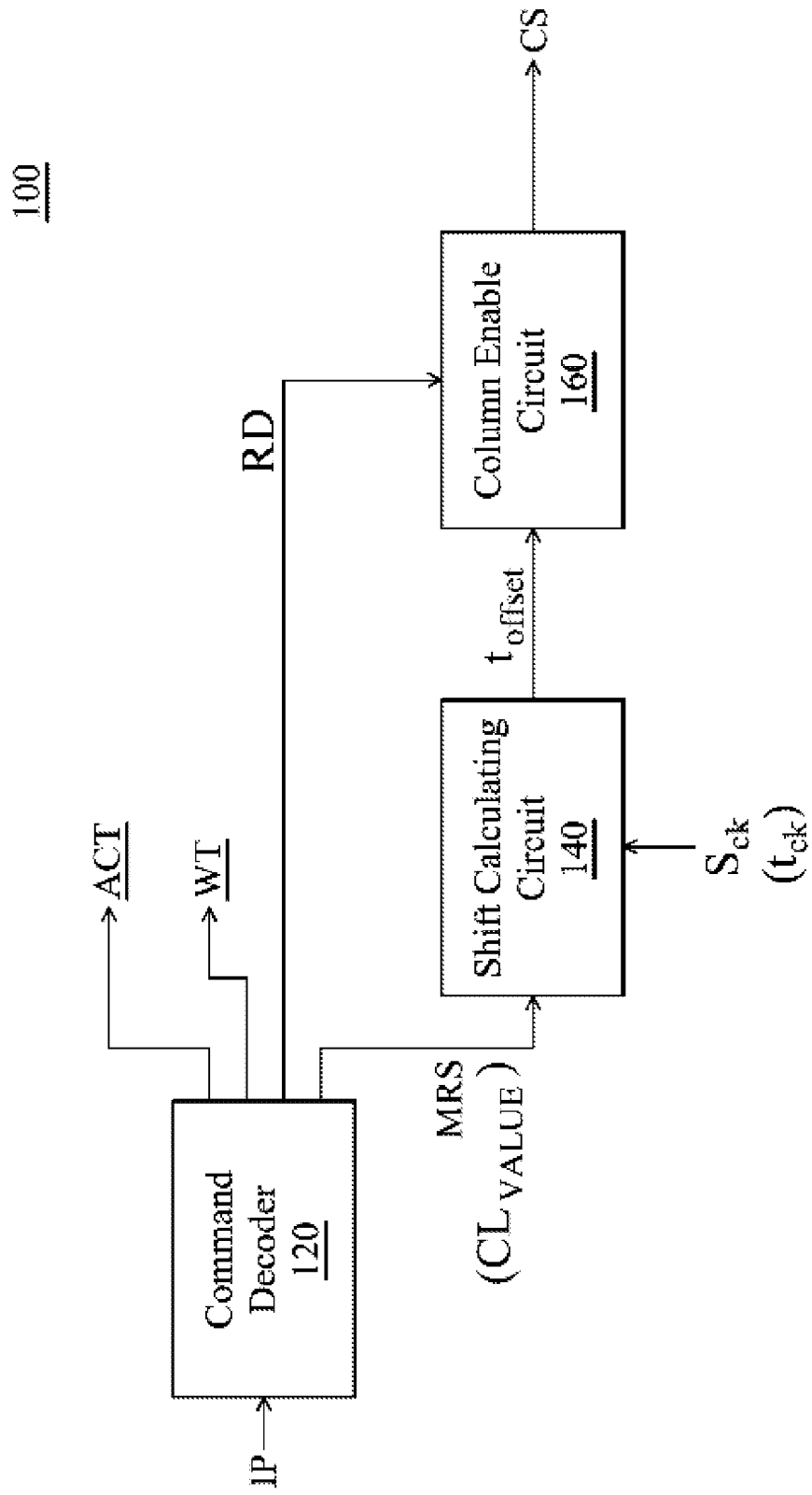
FIG. 1 schematically shows a block diagram of a random access memory circuit in an exemplary embodiment of the disclosure.

The disclosure provides a random access memory that adjusts read timing dynamically and a method thereof. FIG. 1 schematically shows a block diagram of a random access memory circuit 100 in an exemplary embodiment of the disclosure. The random access memory circuit 100 comprises a command decoder 120, a shift calculating circuit 140 and a column enable circuit 160.

The command decoder 120 controls access operation of the random access memory 100. The command decoder 120 receives input signals (IP) and decodes them into corresponding access commands respectively such as active command (ACT), write command (WT), read command (RD) and a mode register command (MRS). The mode register command (MRS) may delivery memory operating configuration including a Column Address Strobe (CAS) value $CL_{VALUE}$ for defining a CAS latency (CL) of the random access memory 100. The CAS latency (CL) may be input directly to or indirectly through a MRS register (not shown in FIG. 1) to the shift calculating circuit 140.

The shift calculating circuit 140 receives the CAS value $CL_{VALUE}$ and generates a shift margin ($t_{offset}$) according to the CAS latency (CL) and a reference latency ($t_{RL\_REF}$). The reference latency ($T_{RL\_REF}$) can be fine-tuned either by fuse trim or soft trim. The shift calculating circuit 140 also receives a clock signal $S_{ck}$ of period $t_{ck}$, from an internal clock tree (not shown in FIG. 1) of the random access memory 100 or an external circuit (not shown in FIG. 1). The shift calculating circuit 140 generates the CAS latency (CL) according to the CAS value $CL_{VALUE}$ and the period $t_{ck}$ of the clock signal $S_{ck}$, and then obtains the difference between the CAS latency (CL) and the reference latency ($t_{RL\_REF}$) as the shift margin ($t_{offset}$). The CAS latency (CL) is provided from the command decoder 120 by MRS command for access control. The reference latency ($t_{RL\_REF}$) may be input to the shifter calculating circuit 140 from the internal circuit which is adjustable timing delay with soft trim or hard trim (fuse trim) in the circuit.

The column enable circuit 160 receives the shift margin ($t_{offset}$) which is calculated according to the equation "$CL_{VALUE} \times t_{ck} - T_{RL\_REF}$", by the shift calculating circuit 140, for adjusting the output timing of generating a Column Select (CS) signal after the command decoder 120 has output the read command (RD).

Figure 2:
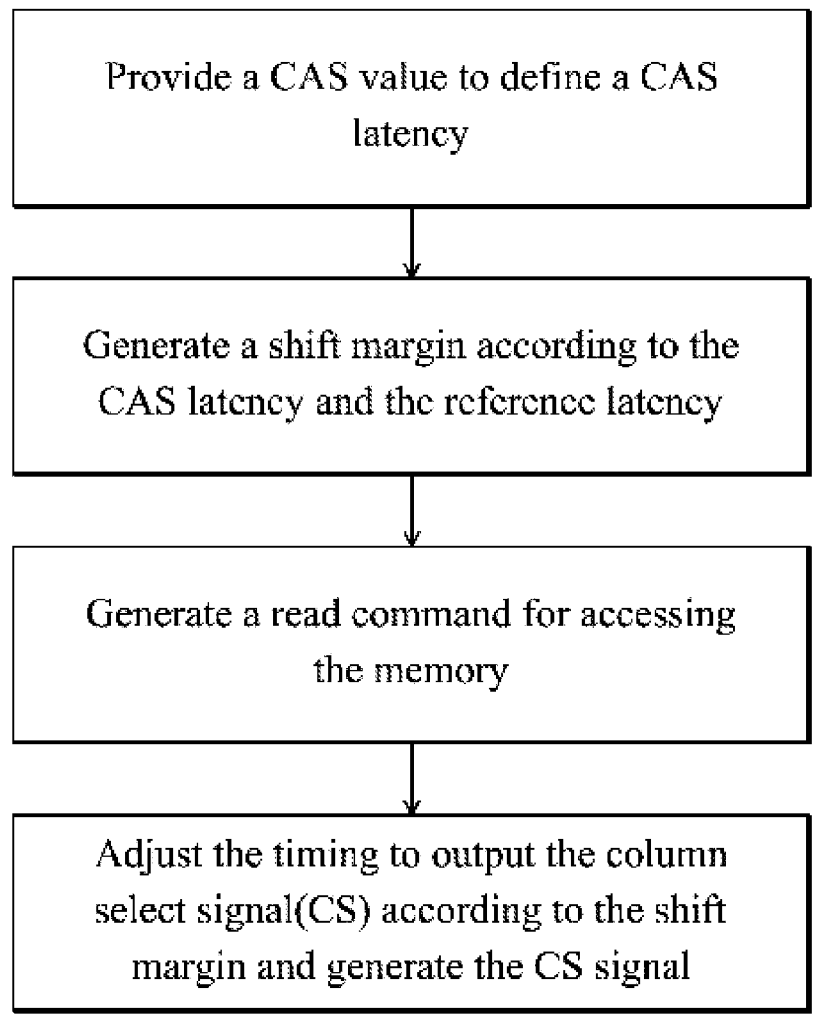
FIG. 2 is a flow chart of the timing adjustment method performed by the random access memory circuit 100 of FIG. 1.

FIG. 2 is a flow chart of the timing adjustment method performed by the random access memory circuit 100 of FIG. 1.

In step S1, the CAS value $CL_{VALUE}$ is provided to the shift calculating circuit 140 for defining the CAS latency (CL) of the random access memory 100. In step S2, the shift calculating circuit 140 generates the shift margin ($t_{offset}$) according to the difference of CAS latency (CL) and the reference latency ($t_{RL\_REF}$). For example, in the speed grade 1066, the CAS value ($CL_{VALUE}$) is configured to be 7 and the period ($t_{ck}$) of the clock signal $S_{ck}$ is configured to be 1.875 ns, and therefore the CAS latency (CL) is 7×1.875=13.125 ns. In one exemplary embodiment, the $t_{RL\_REF}$ may be set to be 12.5 ns from internal circuit. The shift calculating circuit 140 then calculates the difference between the CAS latency (CL) and the reference latency $t_{RL\_REF}$. The shift margin $t_{offset}$ will be 0.625 ns (13.125 ns–12.5 ns), therefore, the following Column Select (CS) signal can be moved 0.625 ns earlier or later. In some embodiments, the reference latency ($t_{RL\_REF}$) may be a minimal allowed CAS latency (CL) of the random access memory 100, but is not limited thereto. For example, the random access memory 100 can operate in different speed grades of 800, 1066, 1333, 1600 and 1866. The speed grade of 800 has the minimal CAS value ($CL_{VALUE}$=5) and a predetermined clock signal of period 2.5 ns and thus has the minimal CAS latency (CL=5×2.5=12.5 ns). For example, in this embodiment, the reference latency $t_{RL\_REF}$ is set to be 12.5 ns, the random access memory 100 operates in speed grade 1066 and thus the shift margin ($t_{offset}$) is 0.625 ns.

In step S3, the command decoder 120 outputs the read command (RD) to access the random access memory 100.

In step S4, the column select circuit 160 adjusts the timing to output the Column Select (CS) signal after the command decoder 120 outputs the read command (RD), according to the shift margin ($t_{offset}$). The timing adjustment of the Column Select (CS) signal is described in detail accompanying with FIGS. 3A~3B as follows.

Figure 3A:
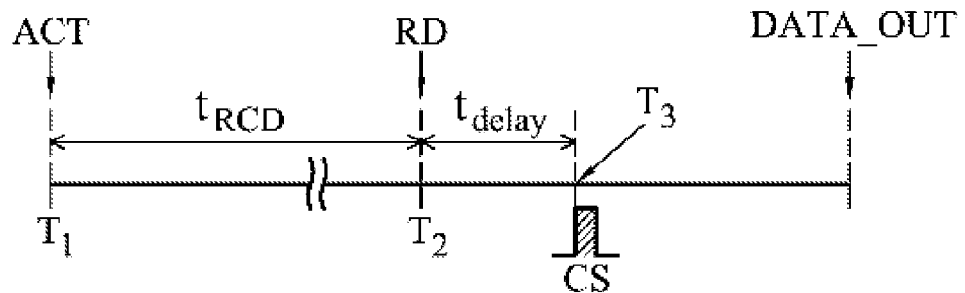
FIGS. 3A to 3C schematically show operation timings of the random access memory 100 in FIG. 1, illustrating the timing adjustment of the Column Select (CS) signal according to an exemplary embodiment of the disclosure.
Figure 3B:
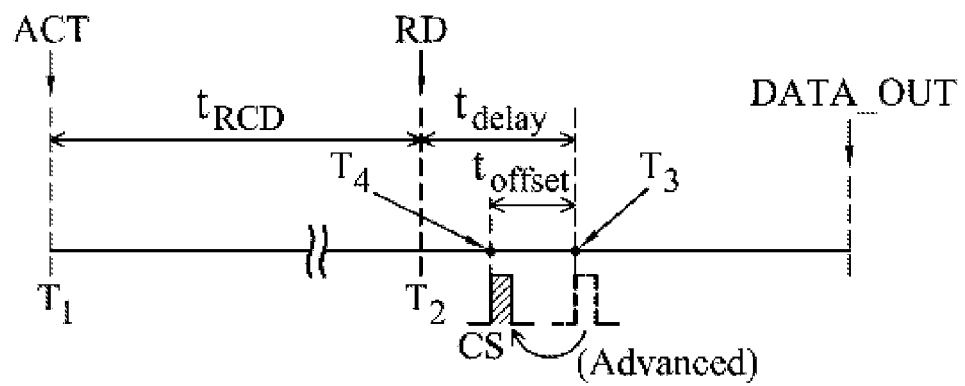
Figure 3C:
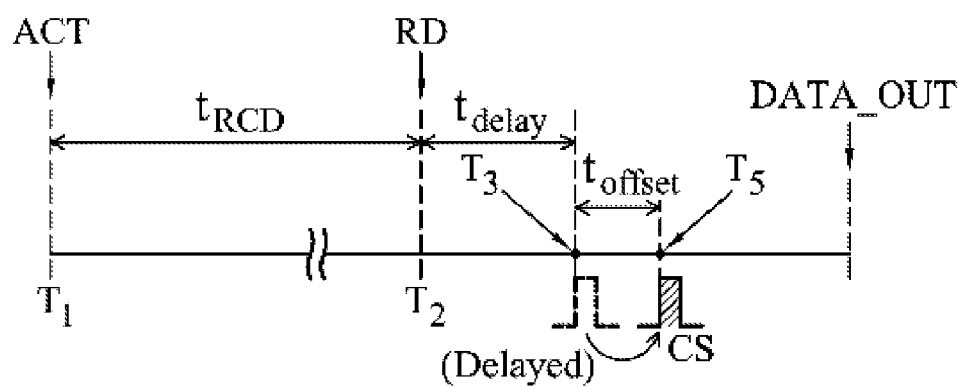

FIGS. 3A to 3C schematically show operation timings of the random access memory 100 in FIG. 1, illustrating the timing adjustment of the Column Select (CS) signal according to an exemplary embodiment of the disclosure.

Before read/write (column addressing) operation to the random access memory 100, an active command (ACT) is output by the command decoder 120 (at time $T_1$). The read command (RD)/write command (WT) must have time separation with respect to the active command (ACT). The time separation is known as RAS to CAS delay ($t_{RCD}$), as shown in FIGS. 3A to 3C. It is noted that the RAS to CAS delay ($t_{RCD}$) is not a fixed time interval and depends on practical application. In this embodiment, the read command RD is output at time $T_2$, for example.

After the read command (RD) is output by the command decoder 120, the column select circuit 160 is configured to output the Column Select (CS) signal for selecting column address, at a first time $T_3$ later than the time ($T_2$) that read command is output by a delay time $t_{delay}$, i.e., the column select circuit 160 does not carry out timing adjustment to the Column Select (CS) signal in conventional art, as shown in FIG. 3A. After the Column Select (CS) signal is output, the data will be sensed and pass through to output for being read out, at the time DATA_OUT as depicted in FIG. 3A.

In FIG. 3B, the column select circuit 160 carries out timing adjustment to the Column Select (CS) signal according to the shift margin ($t_{offset}$). After the column select circuit 160 detects the read command (RD) is output, the column select circuit 160 then outputs the Column Select (CS) signal at the time $T_4$ before the time $T_3$ by the shift margin ($t_{offset}$). Compared with FIG. 3A, the Column Select (CS) signal of FIG. 3B is advanced by the shift margin ($t_{offset}$).

In FIG. 3C, the column select circuit 160 carries out timing adjustment to the Column Select (CS) signal according to the shift margin ($t_{offset}$). After the column select circuit 160 detects the read command (RD) is output, the column select circuit 160 then outputs the Column Select (CS) signal at the time $T_5$ after the time $T_3$ by the shift margin ($t_{offset}$). Compared with FIG. 3A, the Column Select (CS) signal of FIG. 3C is delayed by the shift margin ($t_{offset}$).

Based of the timing adjustment of FIG. 3B, the timing of the Column Select signal is advanced by the shift margin ($t_{offset}$) and therefore operation of Read data-path transmission can afford sufficient processing time and ensure better speed performance at high speed grade. Also, based on the timing adjustment of FIG. 3C, the timing of the Column Select signal is delayed by the shift margin ($t_{offset}$) and therefore operation of bit-line flipping can obtain better $t_{RCD}$ performance.

While the disclosure has been described by way of examples and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of adjusting read timing of a random access memory, comprising:
   providing a Column Address Strobe (CAS) value for defining a CAS latency (CL) of the random access memory;
   generating a shift margin according to the CAS latency and a reference latency;
   generating a read command for accessing the random access memory;
   dynamically generating a Column Select (CS) signal and adjusting output timing of the CS signal according to the shift margin, after the read command is generated;
   wherein adjusting output timing of the CS signal is carried out through advancing or delaying the CS signal from a predetermined output time with the shift margin, where the predetermined output time is later than the read command being output.

2. The method as claimed in claim 1, wherein generating the shift margin is based on a difference between the CAS latency and the reference latency.

3. The method as claimed in claim 1, wherein the reference latency is a minimal allowed CAS latency (CL) of the random access memory.

4. A random access memory, comprising:
   a command decoder, outputting a read command for accessing the random access memory; wherein the command decoder further outputs a mode register (MRS) command having a Column Address Strobe (CAS) value for defining an CAS latency (CL) of the random access memory;
   a shift calculating circuit, generating a shift margin according to the CAS latency and a reference latency; and
   a column enable circuit, generating a Column Select (CS) signal after the command decoder has output the read command and adjusting output timing of the CS signal according to the shift margin;
   wherein the column enable circuit controls the CS signal to be advanced or delayed from a reference time by the shift margin, where the reference time is later than the read command being output.

5. The random access memory as claimed in claim 4, wherein the shift calculating circuit generates the shift margin based on a difference between the CAS latency and the reference latency.

6. The random access memory as claimed in claim 4, wherein the reference latency is a minimal allowed CAS latency (CL) of the random access memory.

* * * * *